(12) United States Patent
Hoi et al.

(10) Patent No.: US 9,978,639 B2
(45) Date of Patent: May 22, 2018

(54) METHODS FOR REDUCING COPPER OVERHANG IN A FEATURE OF A SUBSTRATE

(71) Applicant: APPLIED MATERIALS, INC., Santa Clara, CA (US)

(72) Inventors: Siew Kit Hoi, Singapore (SG); Arvind Sundarrajan, Singapore (SG); Jiao Song, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 8 days.

(21) Appl. No.: 15/335,721

(22) Filed: Oct. 27, 2016

(65) Prior Publication Data

US 2017/0117180 A1 Apr. 27, 2017

Related U.S. Application Data

(60) Provisional application No. 62/247,155, filed on Oct. 27, 2015.

(51) Int. Cl.
*H01L 21/44* (2006.01)
*H01L 21/768* (2006.01)
(Continued)

(52) U.S. Cl.
CPC ...... *H01L 21/76865* (2013.01); *C23C 14/165* (2013.01); *C23C 14/34* (2013.01); *H01J 37/321* (2013.01); *H01J 37/32009* (2013.01); *H01J 37/3244* (2013.01); *H01J 37/32339* (2013.01); *H01L 21/2855* (2013.01);
(Continued)

(58) Field of Classification Search
None
See application file for complete search history.

(56) References Cited

U.S. PATENT DOCUMENTS 9,208,997 B2    12/2015   Nishimura et al.
2006/0178007 A1*   8/2006   Nakamura ........ H01L 21/76843
                                                                  438/675

(Continued)

OTHER PUBLICATIONS

International Search Report and Written Opinion dated Jan. 31, 2017 for PCT Application No. PCT/US2016/059034.

*Primary Examiner* — Calvin Choi
(74) *Attorney, Agent, or Firm* — Moser Taboada; Alan Taboada

(57) ABSTRACT

Methods for forming layers on a substrate having a feature are provided herein. In some embodiments, a method for forming layers on a substrate having a features may include depositing a copper layer within the feature, wherein a thickness of the copper layer disposed on upper corners of an opening of the feature and on an upper portion of a sidewall proximate the upper corners of the feature is greater than the thickness of the copper layer disposed on a lower portion of a sidewall of the feature proximate a bottom of the feature; and exposing the substrate to a plasma formed from a process gas comprising hydrogen ($H_2$) gas to selectively etch the copper layer proximate the upper corners of the opening and the upper portion of the sidewall proximate the upper corners, without substantially etching the copper layer proximate the lower portion of the sidewall proximate the bottom of the feature.

20 Claims, 5 Drawing Sheets

(51) Int. Cl.
  *H01L 21/285* (2006.01)
  *H01L 21/67* (2006.01)
  *H01J 37/32* (2006.01)
  *C23C 14/34* (2006.01)
  *C23C 14/16* (2006.01)

(52) U.S. Cl.
  CPC .. *H01L 21/67069* (2013.01); *H01L 21/76862* (2013.01); *H01L 21/76871* (2013.01)

(56) References Cited

U.S. PATENT DOCUMENTS

| | | | |
|---|---|---|---|
| 2010/0096273 A1* | 4/2010 | Luo | C25D 5/02 205/123 |
| 2011/0147888 A1 | 6/2011 | Steigerwald et al. | |
| 2013/0171822 A1 | 7/2013 | Chandrashekar et al. | |
| 2014/0262755 A1* | 9/2014 | Deshmukh | H01J 37/32431 204/192.35 |
| 2015/0170935 A1 | 6/2015 | Wang et al. | |
| 2015/0255330 A1* | 9/2015 | Lee | H01L 21/76843 438/653 |
| 2016/0042975 A1* | 2/2016 | Ma | H01L 21/32136 438/720 |

* cited by examiner

METHODS FOR REDUCING COPPER OVERHANG IN A FEATURE OF A SUBSTRATE

CROSS-REFERENCE TO RELATED APPLICATIONS

This application claims benefit of U.S. provisional patent application Ser. No. 62/247,155, filed Oct. 27, 2015, which is herein incorporated by reference in its entirety.

FIELD

Embodiments of the present disclosure generally relate to substrate processing.

BACKGROUND

Fabrication of integrated circuits and other microelectronic devices include processes to fill features formed in or on a substrate. For example, such features may be filled with a conductive material to form a conductive pathway between devices or regions of an integrated circuit or microelectronic device. In some processes, such as physical vapor deposition (PVD), a substrate is disposed on a substrate support inside a process chamber and opposite a target of material to be deposited on the substrate. A plasma is formed from a process gas inside of the process chamber to sputter the material from the target and to deposit the material onto the substrate and within the features. These processes can be used to form a layer along the surfaces of the feature and/or to completely fill the feature.

The inventors have observed that one of the most challenging aspects of PVD processes with ever-shrinking semiconductor devices is the buildup of overhang in the features and the incapability to provide sufficient step coverage (e.g., coverage on bottom and sidewalls of the feature as compared to the top surface of the substrate), or more specifically, sidewall coverage with no overhang on the feature top. In particular, the undesirable buildup of material near the upper opening of the features, referred to as overhang, can cause the opening of the feature to be closed off prematurely, undesirably forming a pocket, or void, where no material is present.

Accordingly, the inventors have provided improved methods for forming layers on substrates having one or more features formed in the substrate.

SUMMARY

Embodiments of methods for depositing material in features of a substrate have been provided herein. In some embodiments, a method for forming layers on a substrate having a feature may include depositing a copper layer within the feature, wherein a thickness of the copper layer disposed on upper corners of an opening of the feature and on an upper portion of a sidewall proximate the upper corners of the feature is greater than the thickness of the copper layer disposed on a lower portion of a sidewall of the feature proximate a bottom of the feature; and exposing the substrate to a plasma formed from a process gas comprising hydrogen ($H_2$) gas to selectively etch the copper layer proximate the upper corners of the opening and the upper portion of the sidewall proximate the upper corners, without substantially etching the copper layer proximate the lower portion of the sidewall proximate the bottom of the feature.

In some embodiments, a method for forming layers on a substrate a feature may include depositing a copper layer within the feature, wherein a thickness of the copper layer on upper corners of an opening of the feature and an upper portion of a sidewall proximate the upper corners of the feature is greater than the thickness of the copper layer on a lower portion of a sidewall of the feature proximate a bottom of the feature; forming a plasma from a process gas consisting essentially of hydrogen ($H_2$) gas and one or more noble gases; exposing the substrate to the plasma to selectively etch the copper layer proximate the upper corners of the opening and the upper portion of the sidewall proximate the upper corners, without substantially etching the copper layer proximate the lower portion of the sidewall of the feature proximate the bottom of the feature; and exposing the substrate to a UV light irradiance while etching the copper layer In some embodiments, a computer readable medium is provided having instructions stored thereon that, when executed, causes a process chamber to perform a method for depositing material in a feature of a substrate. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
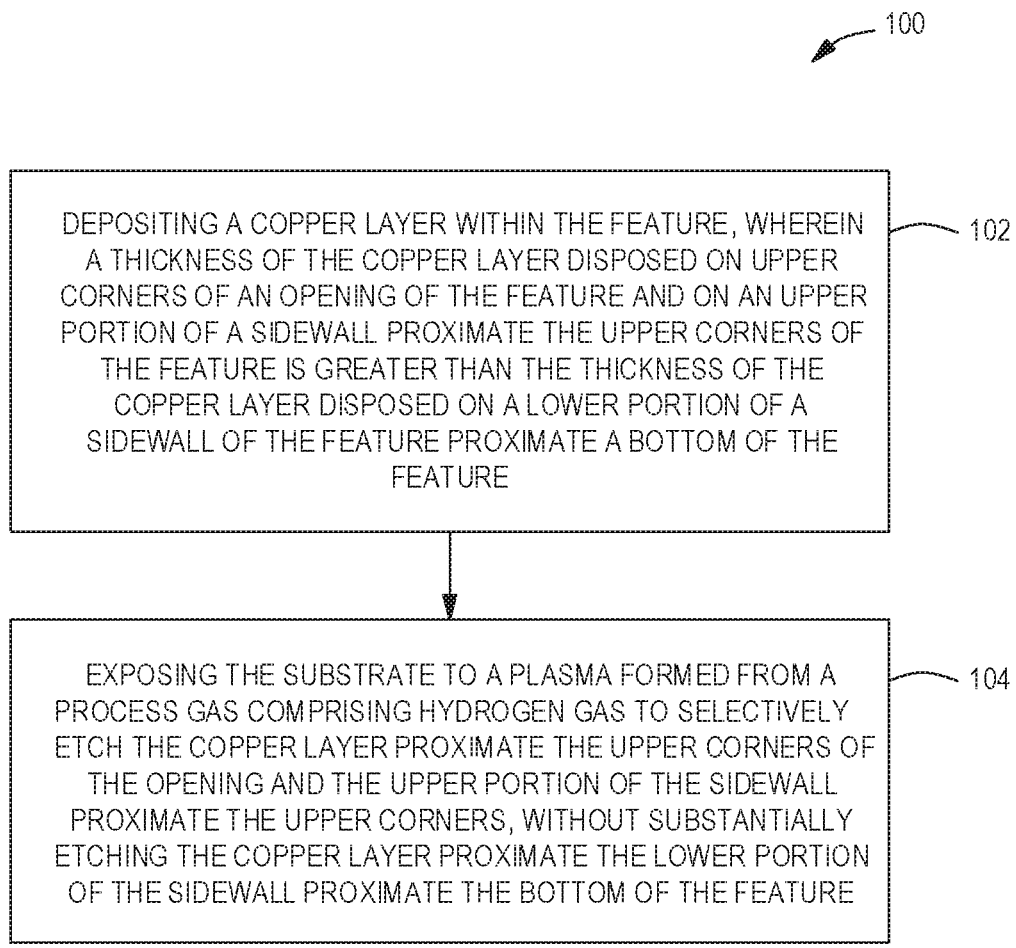
FIG. 1 is a flow diagram of a method for depositing material in features of a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods for depositing material in features formed in or on a substrate are provided herein. Embodiments of the inventive methods may advantageously facilitate reducing or eliminating overhang of material in the feature to lessen the incidence of void formation during feature filling processes. Embodiments of the inventive methods may advantageously be used in metallization in a semiconductor manufacturing process.

FIG. 1 depicts a flow chart of a method 100 for depositing material in features formed in or on a substrate in accordance with some embodiments of the present disclosure. The method 100 is described below with respect to the stages of processing as depicted in FIG. 2A-F.

Figure 2A:
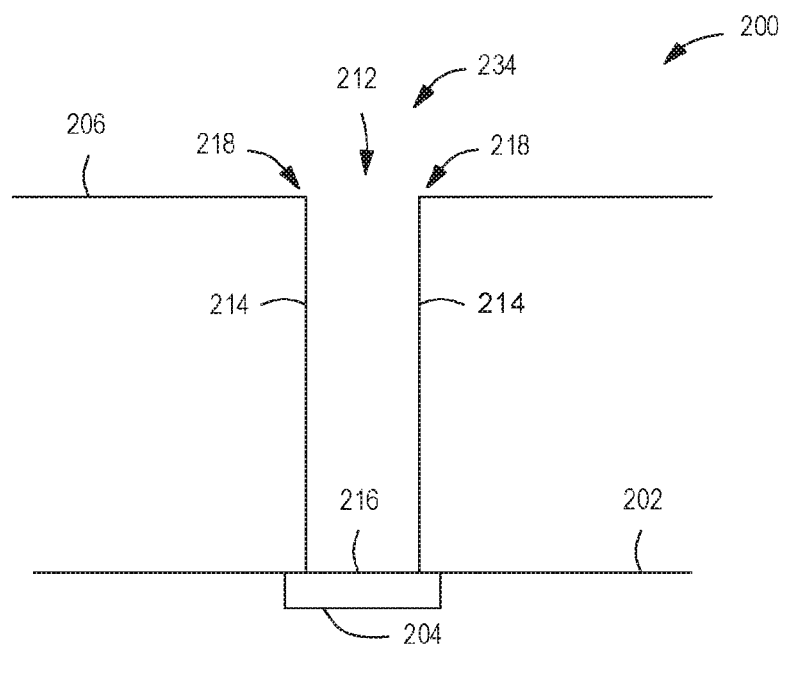
FIGS. 2A-F depict illustrative cross-sectional views of a substrate during different stages of processing in accordance with some embodiments of the present disclosure.
Figure 2B:
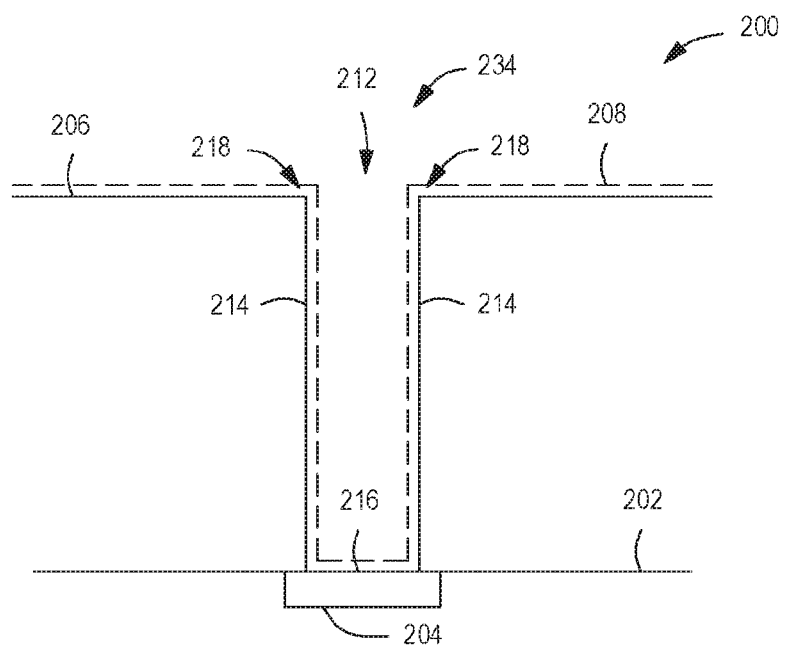

The method 100 is typically performed on a substrate 200 having a feature 234 formed in the substrate 200, as depicted in FIG. 2A. As depicted in FIG. 2A, the substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the substrate 200 may comprise one or more layers, for example, such as a bulk dielectric layer 206 formed over a dielectric layer 202, as depicted in FIG. 2A. A conductive feature 204 may be formed in an upper region of the dielectric layer 202 such that an upper surface of the conductive feature 204 may be exposed by the opening 212 formed in the bulk dielectric layer 206. For example, a via/trench etching process may be performed to define the opening 212 in the bulk dielectric layer 206 to expose an upper surface of the conductive feature 204. The conductive feature 204 may be fabricated from any suitable conductive material. For example, for a copper interconnect, the conductive feature 204 may be a copper layer embedded in the dielectric layer 202. In some embodiments, the conductive feature 204 may be fabricated from a metal, such as copper, aluminum, tungsten, or the like, alloys thereof, or combinations thereof.

The bulk dielectric layer 206 and the dielectric layer 202 may be fabricated from the same or different dielectric materials. In some embodiments, the dielectric materials may comprise silicon oxide ($SiO_2$), silicon nitride (SiN), a low-K material, or the like. The low-k material may be carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. As used herein, low-k materials are materials having a dielectric constant less than about that of silicon oxide, which is about 3.9.

The feature 234 comprises an opening 212, defined by one or more sidewalls 214, a bottom 216 and upper corners (bevel) 218. The feature 234 may be any feature suitable for substrate fabrication, for example such as a via, a trench, a dual damascene feature, or the like, and may be formed through any suitable process such as an etch process. Although only one feature 234 is shown, multiple features may be simultaneously processed in accordance with the teachings disclosed herein. The feature 234 may generally have any dimensions. For example, in some embodiments, the feature 234 may have a ratio of a height of the feature to a width of the feature of at least about 2:1. In some embodiments, the feature 234 may be a high aspect ratio feature. In such embodiments, the feature 234 may have a ratio of a height of the feature to a width of the feature of at least about 4:1, or in some embodiments at least about 10:1. In some embodiments, the feature 234 may have a height of about 50 microns and a width of about 5 microns.

Although the substrate 200 is depicted as having a bulk dielectric layer 206 formed over a dielectric layer 202, the substrate 200 may also include different and/or additional material layers. In addition, other features, such as trenches, vias, or the like, may be formed in different and/or additional material layers.

In some embodiments, a barrier layer 208 may be optionally deposited atop the substrate 200. When present, the barrier layer 208 may serve as an electrical and/or physical barrier between the substrate and layers to be subsequently deposited in the opening, and/or may function as a better surface for attachment during the deposition process discussed below than a native surface of the substrate. The barrier layer 208 may comprise any materials suitable to perform the above discussed functions. For example, in some embodiments, the barrier layer 208 may comprise titanium (Ti), tantalum (Ta), oxides or nitrides thereof, or the like. The barrier layer 208 may be deposited to any suitable thickness, for example, about 0.5 to about 10 nm. The barrier layer 208 may be deposited by any suitable method, for example, such as chemical vapor deposition (CVD), physical vapor deposition (PVD), or the like.

Figure 2C:
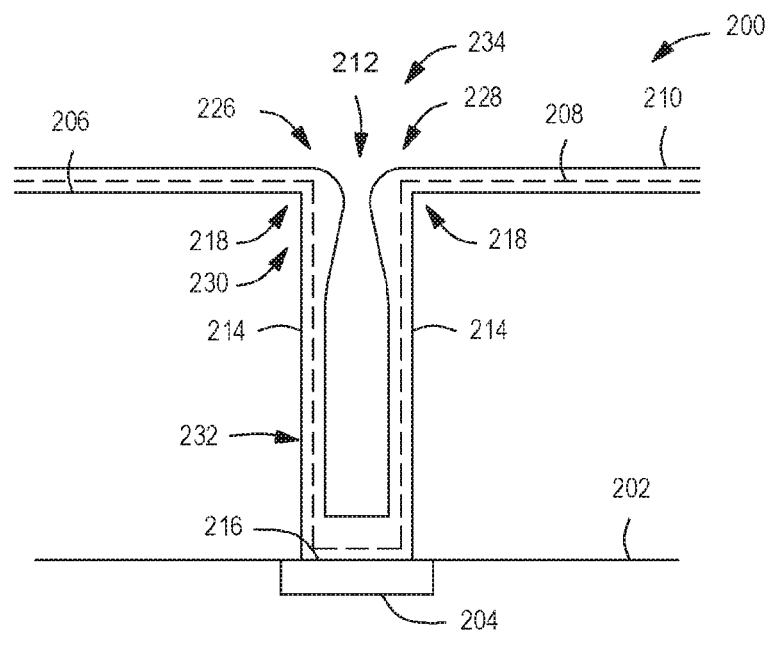

The method begins at 102, where a copper layer 210 is deposited within the opening 212, as depicted in FIG. 2C. In some embodiments, the copper layer 210 is a seed layer providing a better surface for attachment and as a template for subsequently deposited material The copper layer 210 may be deposited via any deposition process suitable to form the layer having a predetermined profile, for example, such as PVD, CVD, or the like. For example, in some embodiments, the copper layer 210 may be deposited via a PVD process in a suitable process chamber.

In some embodiments, depositing the copper layer 210 may include providing a process gas to the process chamber to physically sputter source material from the target, e.g., to cause the target to eject atoms of the target material, which are then directed towards the substrate 200. In some embodiments, the process gas may comprise an noble gas, such as argon (Ar), helium (He), krypton (Kr), neon (Ne), xenon (Xe), or the like. The process gas may be provided at any suitable flow rate to physically sputter source material from the target, for example a flow rate of between about 4 to about 300 sccm. In some embodiments, a plasma may be formed from the process gas to facilitate sputtering the source material from the target. In such embodiments, about 5 to about 40 kW of DC power may be applied to the target to ignite the process gas and maintain the plasma.

In some embodiments, to facilitate directing the ejected atoms from the target towards the substrate 200 a bias power in the form of RF power may be applied to a substrate support pedestal supporting the substrate 200. In such embodiments, about 50 to about 2000 W of RF power may be supplied at a frequency of between 2 to about 60 MHz, or about 13.56 MHz.

In addition to the above, additional process parameters may be utilized to facilitate depositing the copper layer 210. For example, in some embodiments, the process chamber may be maintained at a pressure of about 0.1 to about 50 mTorr. In addition, in some embodiments, the process chamber may be maintained at a temperature of about 20 to about 200 degrees Celsius.

As depicted in FIG. 2C, the thickness of the copper layer 210 disposed on upper corners 218 of an opening 212 of the feature 234 and on an upper portion 230 of the sidewall 218 proximate the upper corners 218 of the feature 234 is greater than the thickness of the copper layer 210 disposed on a lower portion 232 of the sidewall 214 of the feature 234 proximate a bottom 216 of the feature 234. Thus, the inventors have observed that when depositing the copper layer 210 as described above, the copper layer 210 material may accumulate near the upper corners 218 of the opening 212 and the upper portion of the sidewall 214 proximate the upper corners 218. The accumulation of copper layer 210 material may partially or fully close off the opening 212 and create a void within the opening 212.

Figure 2D:
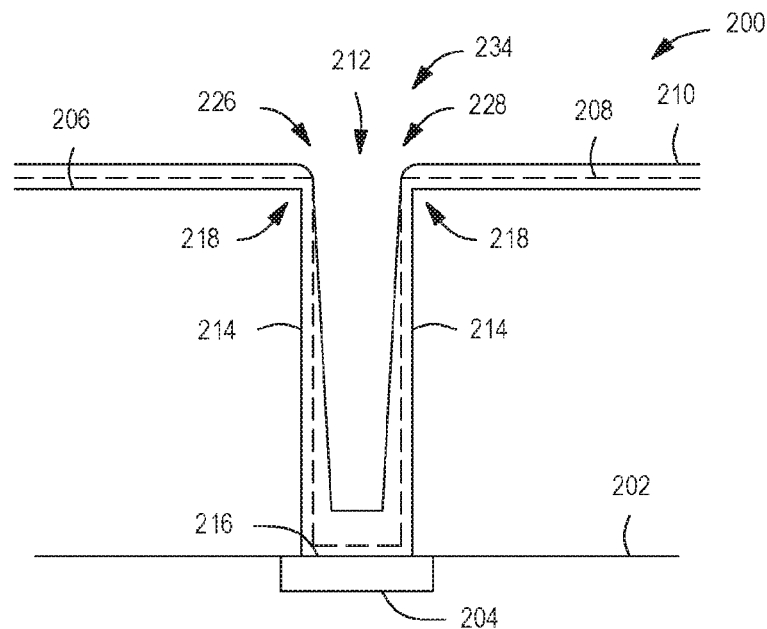

Next at 104, the substrate is exposed to a plasma formed from a process gas comprising hydrogen ($H_2$) gas. In some embodiments, the plasma is formed from a process gas consisting of, or consisting essentially of, hydrogen ($H_2$) gas. In some embodiments, the process gas further comprises one or more noble gases, such as argon (Ar), helium (He), krypton (Kr), neon (Ne), xenon (Xe), or the like. In some embodiments, the process gas consists of, or consists essentially of, hydrogen ($H_2$) gas and one or more noble gases. In some embodiments, the process gas comprises about 90 to about 95 percent hydrogen and the balance being one or more noble gases. For example, in some embodiments, the process gas comprises about 93 percent hydrogen and 7 percent argon. The inventors have observed that exposure to a plasma formed from a process gas as described above selectively etches the copper layer 210 to remove at least a portion of the copper layer 210 proximate the upper corners 218 of the opening 212, as depicted in FIG. 2D (e.g., to provide an etched seed layer), without substantially etching the copper layer 210 proximate the lower portion 232 of the sidewall 214 proximate the bottom 216 of the feature 204. In some embodiments, selectively etching the copper layer 210 to remove at least a portion of the copper layer 210 proximate the upper corners 218 of the opening 212 without substantially etching the copper layer 210 proximate the lower portion 232 of the sidewall 214 proximate the bottom 216 of the feature 204 refers to etching the copper layer 210 proximate the upper corners 218 of the opening 212 at a much faster rate (e.g. an order of magnitude faster) than etching the copper layer 210 proximate the lower portion 232 of the sidewall 214 proximate the bottom 216 of the feature 204. Alternatively, in some embodiments, selectively etching the copper layer 210 to remove at least a portion of the copper layer 210 proximate the upper corners 218 of the opening 212 without substantially etching the copper layer 210 proximate the lower portion 232 of the sidewall 214 proximate the bottom 216 of the feature 204 means that the none or substantially none of the material of the copper layer 210 proximate the lower portion 232 of the sidewall 214 proximate the bottom 216 of the feature 204 is etched while etching the copper layer 210 proximate the upper corners 218 of the opening 212. By etching at least a portion of the copper layer 210, the thickness of the copper layer 210 may be controlled at predetermined locations along the sidewalls 214 proximate the upper corners 218 of the opening 212, to provide an inwardly sloped seed layer profile (e.g., the average copper layer thickness increases from an upper portion 226, 228 of the opening 212 towards the bottom 216 of the opening 212), such as depicted in FIG. 2D.

The copper layer 210 etch may be performed in the same process chamber, or in some embodiments a different process chamber, than the process chamber utilized in the deposition of the copper layer 210 described above. In some embodiments, the process gas may be provided at a flow rate of between about 10 to about 300 sccm. The process gas may be formed into a plasma by coupling a source power to the process gas within the process chamber under suitable conditions to establish and maintain the plasma. For example, in some embodiments, about 5 to about 40 kW of DC power may be provided to ignite the process gas and maintain the plasma. In some embodiments, a bias power may be applied to the substrate to facilitate directing ions from the plasma towards the substrate to facilitate the etching process. For example, in some embodiments, the bias power may be up to about −100 W.

In addition to the above, additional process parameters may be utilized to facilitate etching the copper layer 210. For example, in some embodiments, the process chamber may be maintained at a pressure of about 1 to about 50 mTorr. In addition, in some embodiments, the process chamber may be maintained at a temperature of about 20 to about 200 degrees Celsius.

In some embodiments, the substrate 200 is exposed to UV light while etching the copper seed layer as described at 104. The inventors have observed that the UV light provides an energy source for driving the copper etch process and facilitating etch residue removal. In some embodiments, the substrate 200 is exposed to a UV light having a wavelength of about 150 to about 400 nm (for example about 395 nm). The UV light may also alternately or in combination have at least one of an energy of about 3 eV to about 8 eV, or a flux rate of about $1\times10^{19}$ to about $1\times10^{22}$ photons/($cm^2$–min).

Figure 2E:
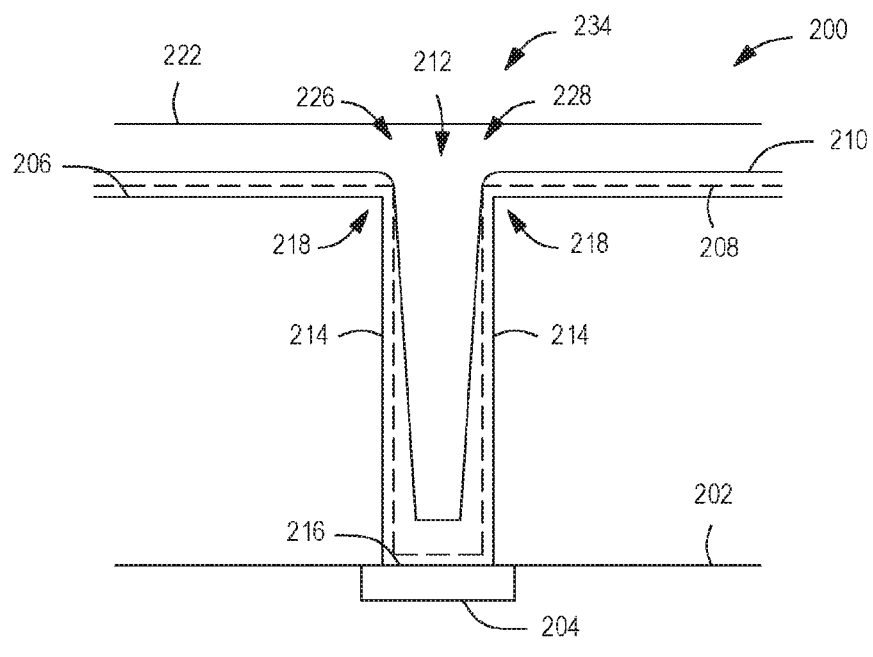

Following the method 100, a conductive material 222 may be deposited atop the copper layer 210 to fill the opening 212, as depicted in FIG. 2E. The conductive material 222 may be deposited in any manner such as electrochemical deposition, or plating (ECP), or the like. The conductive material 222 may be any suitable conductive material, such as aluminum (Al), copper (Cu), or the like.

Figure 2F:
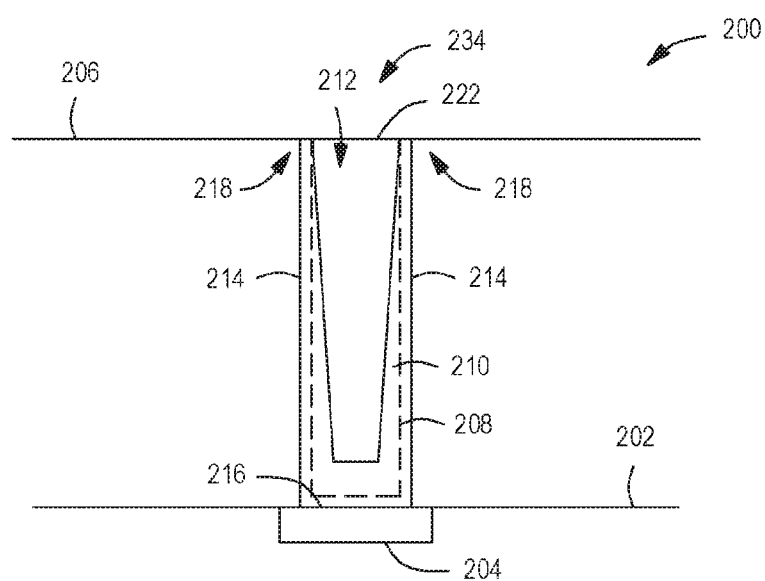

After filling the opening 212 with the conductive material 222, chemical mechanical polishing (CMP) or other suitable technique may be used to remove the excess conductive material 222 outside the opening 212 (and any other features, such as other vias, trenches, dual damascene structures, or the like), as depicted in FIG. 2F.

After depositing the conductive material 222 to fill the opening 212, the substrate 200 may proceed for further processing, such as deposition, etch, annealing, or the like. For example, in some embodiments additional layers may be deposited, for example additional dielectric layers and/or metallization structures may be formed over the filled opening 212.

Figure 3:
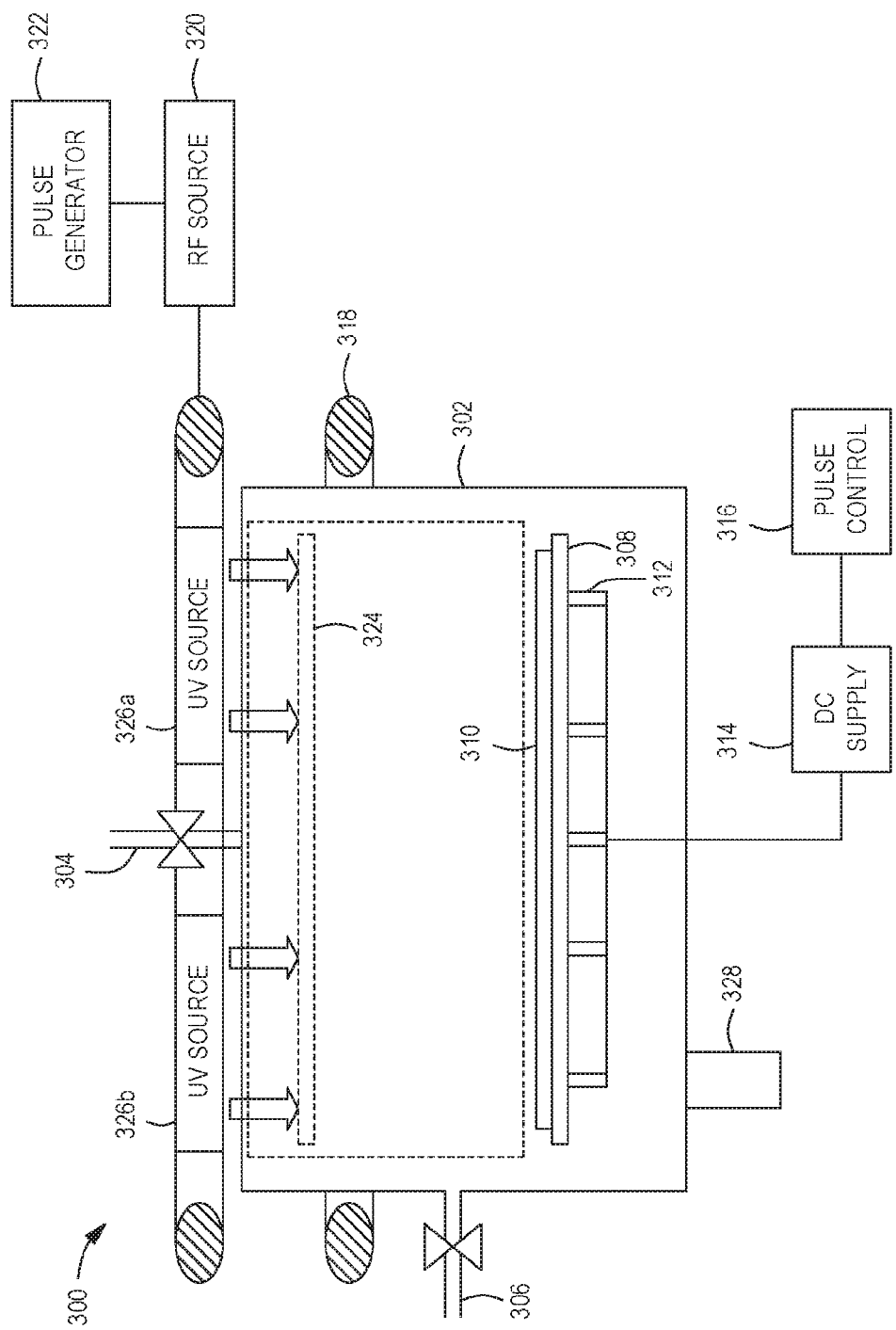
FIG. 3 depicts a process chamber suitable for processing substrates in accordance with some embodiments of the present disclosure.

FIG. 3 illustrates a partial side plan of a substrate etching apparatus 300 according to embodiments provided herein. The etching apparatus includes a chamber 302 having a top gas inlet 304 and a side gas inlet 306 for supplying one or more process gases to the chamber 302. The chamber 302 includes a substrate support 308 for supporting a substrate 310 during etching. In some embodiments, a plurality of conducting pins 312 may contact and/or support the substrate 310 during etching. For example, the conducting pins 312 may provide a pulse DC bias to the substrate 310 to allow biasing of the substrate 310 during etching through use of DC supply 314 and pulse control 316.

The chamber 302 also includes an RF coil 318 for inductively supplying RF energy to the chamber 302 to generate a plasma. The RF energy may be supplied by an RF source 320, and may be pulsed in some embodiments (e.g., using pulse generator 322). A shower head 324 may help uniformly distribute gases supplied to the top gas inlet 304.

In accordance with some embodiments, UV light may be provided to the chamber 302 from one or more UV sources 326a and/or 326b. In some embodiments, UV light having a wavelength of about 150-400 nanometers, or about 3 eV-8 eV of energy, and/or a flux rate of about $1\times10^{15}$-$1\times10^{18}$ photons/(cm2–min) may be employed. Other wavelengths, energies and/or flux rates may be employed. UV light may be applied during any portion of the, or during the entire, etch process.

A pumping system 328 may be employed to evacuate the chamber to a predetermined pressure during etching, and/or to remove volatile etch species generated during etching. 316

Thus, methods for forming layers on a substrate having a feature are provided herein. Embodiments of the inventive methods may advantageously provide a copper layer having a greater thickness disposed on a lower portion of a sidewall of the feature proximate a bottom of the feature as compared to a thickness proximate the opening of the feature. The reduced buildup of material proximate the opening of the feature reduces a buildup of material on the upper corners of the feature, thus preventing or substantially preventing the feature from being closed prior to filling with material. In addition, by providing a copper layer in the manner discussed above, the inventive methods may further advantageously allow for subsequently deposited materials to fill the feature from the bottom of the feature to the top, allowing the feature to be filled completely without or substantially without void formation.

While the foregoing is directed to embodiments of the present disclosure, other and further embodiments of the disclosure may be devised without departing from the basic scope thereof.

The invention claimed is:

1. A method for forming layers on a substrate having a feature, comprising:
    depositing a copper layer within the feature, wherein a thickness of the copper layer disposed on upper corners of an opening of the feature and on an upper portion of a sidewall proximate the upper corners of the feature is greater than the thickness of the copper layer disposed on a lower portion of a sidewall of the feature proximate a bottom of the feature; and
    exposing the substrate to a plasma formed from a process gas comprising a hydrogen gas to selectively etch the copper layer proximate the upper corners of the opening and the upper portion of the sidewall proximate the upper corners, without etching the copper layer proximate the lower portion of the sidewall proximate the bottom of the feature.

2. The method of claim 1, wherein at least substantially all of the copper layer is removed from proximate the opening of the feature.

3. The method of claim 1, wherein the process gas further comprises a noble gas.

4. The method of claim 3, wherein the process gas comprises about 90 to 95 percent hydrogen and the balance noble gas.

5. The method of claim 3, wherein the process gas comprises about 93 percent hydrogen and about 7 percent argon.

6. The method of claim 1, further comprising exposing the substrate to a UV light irradiance while etching the copper layer.

7. The method of claim 6, wherein the UV light has a wavelength of about 395 nm.

8. The method of claim 1, wherein the copper layer is deposited via a physical deposition (PVD) process comprising:
    sputtering a source material from a target in the presence of a plasma formed from a process gas comprising argon (Ar), helium (He), krypton (Kr), neon (Ne) or xenon (Xe).

9. The method of claim 1, wherein the feature comprises a ratio of height to width of at least about 10:1.

10. A method for forming layers on a substrate having a feature, comprising:
    depositing a copper layer within the feature, wherein a thickness of the copper layer on upper corners of an opening of the feature and an upper portion of a sidewall proximate the upper corners of the feature is greater than the thickness of the copper layer on a lower portion of a sidewall of the feature proximate a bottom of the feature;
    forming a plasma from a process gas comprising about 93 percent hydrogen and about 7 percent argon;
    exposing the substrate to the plasma to selectively etch the copper layer proximate the upper corners of the opening and the upper portion of the sidewall proximate the upper corners, without etching the copper layer proximate the lower portion of the sidewall of the feature proximate the bottom of the feature; and
    exposing the substrate to a UV light irradiance while etching the copper layer.

11. The method of claim 10, wherein substantially all of the copper layer is removed from proximate the opening of the feature.

12. The method of claim 10, wherein the UV light has a wavelength of about 395 nm.

13. The method of claim 10, wherein the feature comprises a ratio of height to width of at least about 10:1.

14. The method of claim 10, wherein the copper layer is deposited via a physical deposition (PVD) process comprising:
    sputtering a source material from a target in the presence of a plasma formed from a process gas comprising argon (Ar), helium (He), krypton (Kr), neon (Ne) or xenon (Xe).

15. A non-transitory computer readable medium having instructions stored thereon that, when executed, cause a method for forming layers on a substrate having a feature to be performed in a process chamber, the method comprising:
    depositing a copper layer within the feature, wherein a thickness of the copper layer disposed on upper corners of an opening of the feature and an upper portion of a sidewall proximate the upper corners of the feature is greater than the thickness of the copper layer disposed on a lower portion of a sidewall of the feature proximate a bottom of the feature;
    forming a plasma from a process gas comprising about 93 percent hydrogen and about 7 percent argon;
    exposing the substrate to the plasma to selectively etch the copper layer proximate the upper corners of the opening and the upper portion of the sidewall proximate the upper corners, without etching the copper layer proximate the lower portion of the sidewall of the feature proximate the bottom of the feature; and
    exposing the substrate to a UV light irradiance while etching the copper layer.

16. The computer readable medium of claim 15, wherein substantially all of the copper layer is removed from proximate the opening of the feature.

17. The computer readable medium of claim 15, wherein the UV light has a wavelength of about 395 nm.

18. The computer readable medium of claim 15, wherein the feature comprises a ratio of height to width of at least about 10:1.

19. The computer readable medium of claim 15, wherein the feature comprises a ratio of height to width of at least about 10:1.

20. The computer readable medium of claim 15, wherein the copper layer is deposited via a physical deposition (PVD) process comprising:

sputtering a source material from a target in the presence of a plasma formed from a process gas comprising argon (Ar), helium (He), krypton (Kr), neon (Ne) or xenon (Xe).

* * * * *